United States Patent
Izumi et al.

(10) Patent No.: US 10,483,126 B2
(45) Date of Patent: Nov. 19, 2019

(54) SEMICONDUCTOR MANUFACTURING APPARATUS AND MANUFACTURING METHOD OF SEMICONDUCTOR DEVICE

(71) Applicant: TOSHIBA MEMORY CORPORATION, Minato-ku (JP)

(72) Inventors: Takashi Izumi, Yokkaichi (JP); Fumitoshi Ikegaya, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 56 days.

(21) Appl. No.: 15/697,615

(22) Filed: Sep. 7, 2017

(65) Prior Publication Data
US 2018/0226268 A1 Aug. 9, 2018

(30) Foreign Application Priority Data
Feb. 3, 2017 (JP) .................................. 2017-018976

(51) Int. Cl.
*H01L 21/3213* (2006.01)
*H01L 21/67* (2006.01)
*C25D 17/00* (2006.01)
*C25D 5/48* (2006.01)
*H01L 21/02* (2006.01)

(52) U.S. Cl.
CPC .......... *H01L 21/32134* (2013.01); *C25D 5/48* (2013.01); *H01L 21/67023* (2013.01); *H01L 21/67051* (2013.01); *C25D 17/001* (2013.01); *H01L 21/02087* (2013.01)

(58) Field of Classification Search
None
See application file for complete search history.

(56) References Cited

U.S. PATENT DOCUMENTS

| | | | |
|---|---|---|---|
| 6,365,017 B1 | 4/2002 | Hongo et al. | |
| 6,716,330 B2 * | 4/2004 | Hongo | C23C 18/1619 204/232 |
| 6,793,769 B2 * | 9/2004 | Kajino | C03C 15/00 134/33 |
| 7,332,055 B2 * | 2/2008 | Orii | B08B 3/02 118/730 |
| 2009/0090467 A1 * | 4/2009 | Lee | H01L 21/67051 156/345.23 |

FOREIGN PATENT DOCUMENTS

| | | |
|---|---|---|
| JP | 2003-183892 A | 7/2003 |
| JP | 2005-68561 A | 3/2005 |
| JP | 2006-104581 A | 4/2006 |

* cited by examiner

*Primary Examiner* — Sylvia MacArthur
(74) *Attorney, Agent, or Firm* — Oblon, McClelland, Maier & Neustadt, L.L.P.

(57) ABSTRACT

A semiconductor manufacturing apparatus according to the present embodiment has a mount unit capable of mounting a substrate. A first supplier supplies a chemical solution onto the substrate. A first protection plate is provided along an outer circumference of the substrate, to receive the chemical solution splashing from the substrate. A second supplier is provided above the first protection plate, to supply a cleaning solution to an inner surface of the first protection plate.

1 Claim, 5 Drawing Sheets

| Step | 10 | 20 | 30 | 40 | 50 | 60 |
|---|---|---|---|---|---|---|
| Name | CLEANING | Bevel Etch | CLEANING | REAR SURFACE ETCHING | CLEANING | DRY |
| ROTATION SPEED (rpm) | 200 | 200 | 200 | 200 | 400 | 1300 |
| SOLVENT | DIW | $H_2SO_4$, $H_2O_2$ | DIW | $H_2SO_4$ | DIW | - |

FIG.4

SEMICONDUCTOR MANUFACTURING APPARATUS AND MANUFACTURING METHOD OF SEMICONDUCTOR DEVICE

CROSS REFERENCE TO RELATED APPLICATIONS

This application is based upon and claims the benefit of priority from the prior Japanese Patent Application No. 2017-018976, filed on Feb. 3, 2017, the entire contents of which are incorporated herein by reference.

FIELD

Embodiments relate to a semiconductor manufacturing apparatus and a manufacturing method of a semiconductor device.

BACKGROUND

A semiconductor manufacturing apparatus such as a metal plating apparatus may perform etching, washing with a cleaning solution, and drying to an edge part of a substrate in a semiconductor-device manufacturing process. However, when the semiconductor manufacturing apparatus performs those processes in the same chamber, appearance abnormality (streaks) may occur on the substrate surface. The streaks appear when a chemical solution present in the chamber is attached to the substrate during substrate drying.

Part of the substrate where streaks appear has been more oxidized than a normal part of the substrate. Therefore, there is a difference in appearance between the part where the streaks appear and the normal part. The substrate having the streaks appearing is inevitably detected to be poor in appearance inspection. Therefore there is a demand to restrict streaks.

BRIEF DESCRIPTION OF THE DRAWINGS

FIG. 4 is a table showing an example of processes of bevel etching, water-washing and drying, after a plating process, according to the first embodiment;

DETAILED DESCRIPTION

A semiconductor manufacturing apparatus according to the present embodiment is provided with a mount unit capable of mounting a substrate. A first supplier supplies a chemical solution onto the substrate. A first protection plate is provided along an outer circumference of the substrate, to receive the chemical solution splashing from the substrate. A second supplier is provided above the first protection plate, to supply a cleaning solution to an inner surface of the first protection plate.

Embodiments will now be explained with reference to the accompanying drawings, although not limited to thereto.

First Embodiment

Figure 1:
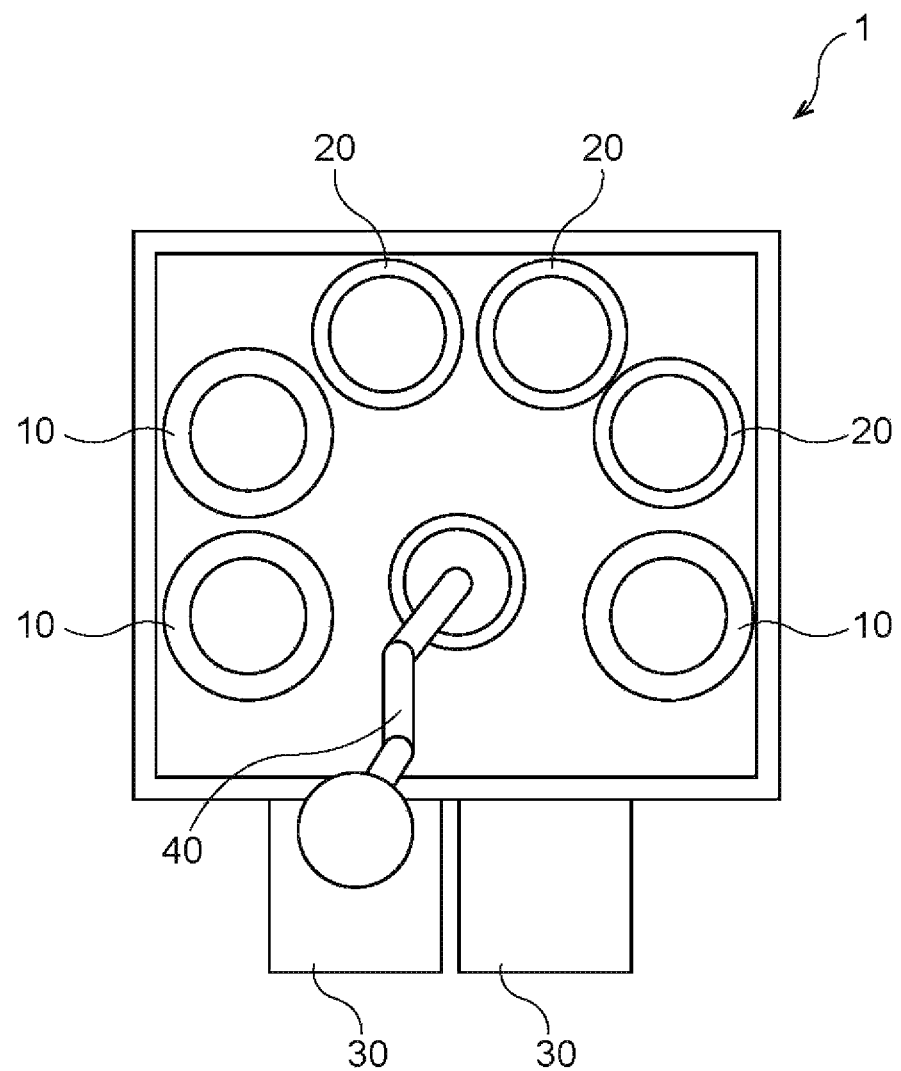
FIG. 1 is a schematic plan view showing an example of the configuration of a semiconductor manufacturing apparatus according to a first embodiment.

FIG. 1 is a schematic plan view showing an example of the configuration of a semiconductor manufacturing apparatus 1 according to the present embodiment. The semiconductor manufacturing apparatus 1 is, for example, a semiconductor manufacturing apparatus for etching part of a material film on a substrate, such as a plating apparatus and an etching apparatus. Hereinafter, an explanation will be made on condition that, in the present embodiment, the semiconductor manufacturing apparatus 1 is a copper plating apparatus.

The semiconductor manufacturing apparatus 1 is provided with film deposition chambers 10, cleaning chambers 20, carrier boxes 30, and a transfer unit 40.

Each film deposition chamber 10 is capable of accommodating a wafer W, for forming a material film on the wafer W. The film deposition chamber 10 is, for example, a plating chamber for copper plating on the wafer W. In order for copper plating, the film deposition chamber 10 is not necessarily airtight. Nevertheless, the film deposition chamber 10 may be airtight like a chamber of an etching apparatus. The wafer W may, for example, be a semiconductor substrate such as a silicon substrate.

Each cleaning chamber 20 is capable of accommodating the wafer W, for etching part of the wafer W and of a copper film plated on the wafer W, and for cleaning and dry the wafer W after the etching. For easy transfer of the wafer W, the cleaning chamber 20 performs etching to an edge part of or a peripheral part (hereinafter, also referred to as a bevel part) of the wafer W and to the rear surface of the wafer W where copper-film plating should not be performed. After etching to the bevel part of the wafer W, the cleaning chamber 20 washes the wafer W with water and dries the washed water W. Like the film deposition chamber 10, the cleaning chamber 20 may be airtight or may be opened.

Each carrier box 30 is a box to accommodate the wafer W and transfers the wafer W between semiconductor manufacturing apparatuses.

The transfer unit 40 is, for example, a robot hand, for transferring the wafer W among the film deposition chambers 10, the cleaning chambers 20, and the carrier boxes 30.

FIG. 1 shows three film deposition chambers 10 and also three cleaning chambers 20. However, the number of the film deposition chambers 10 and also the cleaning chambers 20 is not limited to three.

Figure 2:
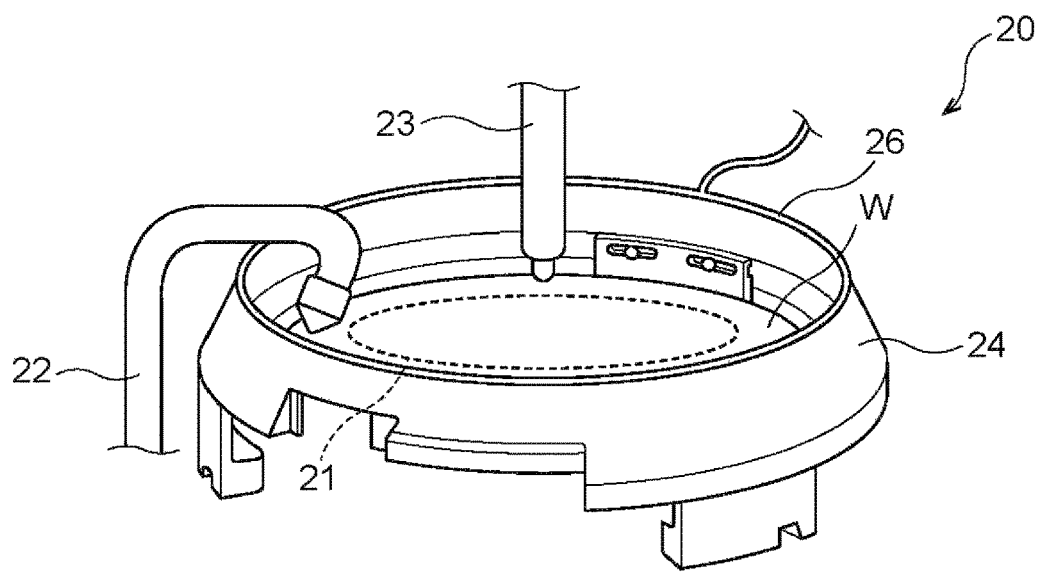
FIG. 2 is a schematic view showing an example of the configuration of a cleaning chamber.
Figure 3:
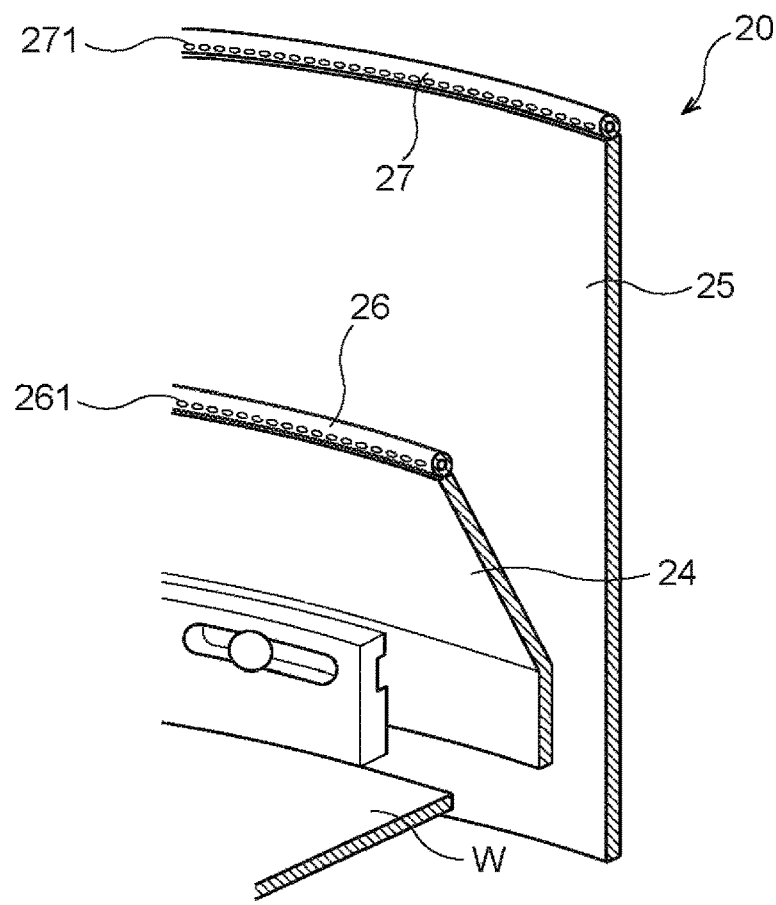
FIG. 3 is a fragmentary sectional view of the configuration of the cleaning chamber.

FIG. 2 is a schematic view showing an example of the configuration of each cleaning chamber 20. FIG. 3 is a fragmentary sectional view of the configuration of the cleaning chamber 20. The internal configuration of the cleaning chamber 20 will be explained in more detail by referring to FIGS. 2 and 3.

The cleaning chamber 20 is provide with a stage 21, a chemical-solution supply nozzle 22, a pure-water supply nozzle 23, a first protection plate 24, a second protection plate 25, a cleaning-solution supply pipe 26, and a cleaning-solution supply pipe 27. Although omitted in FIG. 2, the second protection plate 25 and the cleaning-solution supply pipe 27 are shown in FIG. 3.

The stage 21, as a mount unit, is capable of mounting the wafer W as a substrate. The stage 21 may be a chuck for absorbing the wafer W. The stage 21 is provided with a rotation mechanism for rotating the wafer W. Having this mechanism, the stage 21 can rotate the wafer W while processing the wafer W.

The chemical-solution supply nozzle 22, as a first supplier, supplies an etching solution, as a chemical solution, onto the bevel part of the wafer W toward the outside of the wafer W in an obliquely downward direction so that the etching solution does not splash onto the center part of the wafer W. In this way, a copper film located on the bevel part of the wafer W is etched while a copper film located on the center part of the wafer W is not etched. In copper-film etching, the etching solution may, for example, be a mixture of sulfuric acid ($H_2SO_4$) and hydrogen peroxide ($H_2O_2$). As shown in FIG. 2, the chemical-solution supply nozzle 22 supplies the chemical solution onto the bevel part of the wafer W to etch a copper film on an edge part of the wafer W.

The pure-water supply nozzle 23, as a fourth supplier, supplies pure water (DIW (Deionized Water)) as a cleaning solution onto the wafer W after copper-film etching. The pure-water supply nozzle 23 supplies the pure water onto the center part of the wafer W. The pure-water supply nozzle 23 supplies the pure water onto the wafer W to wash the wafer W. In this way, the pure-water supply nozzle 23 washes away the etching solution on the bevel part of the wafer W.

The first protection plate 24 is provided around the peripheries of the wafer W and the stage 21 along the outer circumferences of the wafer W and the stage 21, having a cylindrical or ring shape, for example. The inner surface of the first protection plate 24 is inclined to an almost vertical direction so that the first protection plate 24 has a smaller diameter in an upward direction. However, as described later, the inner surface of the first protection plate 24 may be extended in the almost vertical direction without being inclined. Used for the first protection plate 24 is, for example, stainless steel, a resin, etc. The first protection plate 24 may be provided to surround the peripheries of the wafer W and the stage 21 entirely or provided around part of the peripheries.

The first protection plate 24 functions to receive the etching solution and the pure water splashing from the wafer W and drop them in a downward direction of the cleaning chamber 20. For example, in copper-film etching, the etching solution supplied from the chemical-solution supply nozzle 22 located above the wafer W is dropped onto the bevel part of the wafer W and then rebounds to be scattered therefrom. The stage 21 continuously rotates the wafer W while the chemical-solution supply nozzle 22 is supplying the etching solution onto the wafer W and the pure-water supply nozzle 23 supplies the pure water onto the wafer W. Because of this, the etching solution and the pure water splash toward the periphery of the wafer W by centrifugal force. The first protection plate 24 receives the etching solution and the pure water splashing from the wafer W and drop them in the downward direction of the cleaning chamber 20. In this way, the first protection plate 24 can restrict splashing of the etching solution and the pure water from the wafer W, around the cleaning chamber 20. The chemical solutions dropped in the downward direction of the cleaning chamber 20 are collected or discharged.

The cleaning-solution supply pipe 26, as a second supplier, is provided along an upper edge part of the first protection plate 24. The cleaning-solution supply pipe 26 is a hollow tube extended along the upper edge part of the first protection plate 24, allowing the pure water to flow therein. Used for the cleaning-solution supply pipe 26 is, for example, stainless steel, a resin, etc., like the first protection plate 24. The material of the cleaning-solution supply pipe 26 may be or may not be the same as the material of the first protection plate 24. Moreover, the cleaning-solution supply pipe 26 may be formed separated from or integral with the first protection plate 24. Furthermore, the cleaning-solution supply pipe 26 may be provided to surround the peripheries of the wafer W and the stage 21, together with the first protection plate 24, or may be provided around part of the peripheries. In other words, the cleaning-solution supply pipe 26 may be provided at the entire upper edge part of the first protection plate 24 or at part of the upper edge part of the first protection plate 24.

As shown in FIG. 3, the cleaning-solution supply pipe 26 has a plurality of first holes 261 at the inner surface side of the first protection plate 24 and in the vicinity of the inner surface thereof. The first holes 261 penetrate from the outside of the cleaning-solution supply pipe 26 to the inside thereof so that the pure water can flow from the inside of the cleaning-solution supply pipe 26 to the outside thereof. Since the first holes 261 are provided at the inner surface side of the first protection plate 24 and in the vicinity of the inner surface thereof, the pure water that flows out from the cleaning-solution supply pipe 26 is supplied to the inner surface of the first protection plate 24 and flows along the inner surface thereof. In detail, the pure water from the cleaning-solution supply pipe 26 flows in the downward direction of the camber 20 while being in contact with the inner surface of the first protection plate 24, to wash away the etching solution attached to the inner surface of the first protection plate 24 to remove the etching solution from the first protection plate 24. Since the cleaning-solution supply pipe 26 is provided at the upper edge part of the first protection plate 24, it is capable of cleaning the inner surface of the first protection plate 24 from the upper to lower edges thereof entirely. Moreover, if the cleaning-solution supply pipe 26 is provided at the entire upper edge part of the first protection plate 24, it can clean the entire inner surface of the first protection plate 24. It is preferable that the diameters of and the interval between the first holes 261 are adjusted so that the pure water can be supplied to the entire inner surface of the first protection plate 24.

A pipe (not shown) for transferring the pure water to the cleaning-solution supply pipe 26 may be the same as, for example, a pipe for transferring the pure water to the pure-water supply nozzle 23. In other words, the pipe for transferring the pure water to the cleaning-solution supply pipe 26 may be a pipe branched from the pipe for transferring the pure water to the pure-water supply nozzle 23. As a matter of course, not limited to that, the pipe for transferring the pure water to the cleaning-solution supply pipe 26 and the pipe for transferring the pure water to the pure-water supply nozzle 23 may be separated from each other.

As shown in FIG. 3, the second protection plate 25 is provided at the outside of the first protection plate 24, along the outer circumferences of the wafer W and the stage 21, having a cylindrical or ring shape, for example. The second protection plate 25 is extended in the almost vertical direction without being inclined, however, the second protection plate 25 may be inclined from the almost vertical direction, like the first protection plate 24. Used for the second protection plate 25 is, for example, stainless steel, a resin, etc. The second protection plate 25 may be provided to surround the peripheries of the wafer W and the stage 21 entirely or provided around part of the peripheries.

The second protection plate 25 functions to receive the etching solution and the pure water splashing over the first protection plate 24 and drop them in the downward direction of the cleaning chamber 20. It is therefore preferable that the second protection plate 25 is provided higher than the first protection plate 24. With this arrangement, the second protection plate 25 can restrict splashing of the etching solution and the pure water from the wafer W, around the cleaning chamber 20. The chemical solutions dropped in the downward direction of the cleaning chamber 20 are collected or discharged.

The cleaning-solution supply pipe 27, as a third supplier, is provided along an upper edge part of the second protection plate 25, as shown in FIG. 3. The cleaning-solution supply pipe 27 is a hollow tube extended along the upper edge part of the second protection plate 25, allowing the pure water to flow therein. Used for the cleaning-solution supply pipe 27 is, for example, stainless steel, a resin, etc., like the first protection plate 25. The material of the cleaning-solution supply pipe 27 may be or may not be the same as the material of the second protection plate 25. Moreover, the cleaning-solution supply pipe 27 may be formed separated from or integral with the second protection plate 25. Furthermore, the cleaning-solution supply pipe 27 may be provided to surround the peripheries of the wafer W and the stage 21, together with the second protection plate 25, or may be provided around part of the peripheries. In other words, the cleaning-solution supply pipe 27 may be provided at the entire upper edge part of the second protection plate 25 or at part of the upper edge part.

As shown in FIG. 3, the cleaning-solution supply pipe 27 has a plurality of second holes 271 at the inner surface side of the second protection plate 25 and in the vicinity of the inner surface thereof. The second holes 271 penetrate from the outside of the cleaning-solution supply pipe 27 to the inside thereof so that the pure water can flow from the inside of the cleaning-solution supply pipe 27 to the outside thereof. Since the second holes 271 are provided at the inner surface side of the second protection plate 25 and in the vicinity of the inner surface thereof, the pure water that flows out from the cleaning-solution supply pipe 27 is supplied to the inner surface of the second protection plate 25 and flows along the inner surface thereof. In detail, the pure water from the cleaning-solution supply pipe 27 flows in the downward direction of the camber 20 while being in contact with the inner surface of the second protection plate 25, to wash away the etching solution attached to the inner surface of the second protection plate 25 to remove the etching solution from the second protection plate 25. Since the cleaning-solution supply pipe 27 is provided at the upper edge part of the second protection plate 25, it is capable of cleaning the inner surface of the second protection plate 25 from the upper to the lower edges thereof entirely. Moreover, if the cleaning-solution supply pipe 27 is provided at the entire upper edge part of the second protection plate 25, it can clean the entire inner surface of the second protection plate 25. It is preferable that the diameters of and the interval between the second holes 271 are adjusted so that the pure water can be supplied to the entire inner surface of the second protection plate 25.

A pipe (not shown) for transferring the pure water to the cleaning-solution supply pipe 27 may be the same as, for example, a pipe for transferring the pure water to the pure-water supply nozzle 23 or to the cleaning-solution supply pipe 26. In other words, the pipe for transferring the pure water to the cleaning-solution supply pipe 27 may be a pipe branched from the pipe for transferring the pure water to the pure-water supply nozzle 23 or to the cleaning-solution supply pipe 26. As a matter of course, not limited to that, the pipe for transferring the pure water to the cleaning-solution supply pipe and the pipe for transferring the pure water to the pure-water supply nozzle 23 or to the cleaning-solution supply pipe 26 may be separated from each other.

As described above, the first protection plate 24 is inclined upward so as to have a smaller diameter in the upward direction. In other words, the inner surface of the first protection plate 24 is inclined as being closer to the substrate W or the stage 21. The angle of inclination of the inner surface of the first protection plate 24 is, for example, 45 degrees from the almost vertical direction. If the angle of inclination is large, the pure water from the cleaning-solution supply pipe 26 is directly dropped downward because the pure water cannot flow along the inner surface of the first protection plate 24. Therefore, the angle of inclination of the inner surface of the first protection plate 24 is required to be a degree of angle to the extent that the pure water from the cleaning-solution supply pipe 26 flows along the inner surface of the first protection plate 24. For example, it is preferable that the angle of inclination is about zero to 45 degrees with respect to the almost vertical direction. The first protection plate 24 may be provided in the almost vertical direction (about zero degrees). Because of this, the pure water from the cleaning-solution supply pipe 26 can easily flow along the inner surface of the first protection plate 24. The same as above can be applied to the angle of inclination of the inner surface of the second protection plate 25.

Moreover, the inner surfaces of the first and second protection plates 24 and 25 may be hydrophilic. The hydrophilicity in this case means that a contact angle between the inner surfaces of the first and second protection plates 24 and 25, and the pure water is less than 90 degrees. With such hydrophilicity, wettability of the inner surfaces of the first and second protection plates 24 and 25 improves so that the pure water can easily flow along the inner surfaces of the first and second protection plates 24 and 25. Accordingly, the cleaning-solution supply pipes 26 and 27 can further efficiently wash way the etching solution from the first and second protection plates 24 and 25. As a matter of course, as long as the pure water can flow along the inner surfaces of the first and second protection plates 24 and 25, the inner surfaces of the first and second protection plates 24 and 25 may not be hydrophilic and the above-mentioned contact angle may be equal to or larger than 90 degrees.

Having the configuration described above, the copper plaiting apparatus 1 of the present embodiment is capable of, with the cleaning-solution supply pipes 26 and 27 in the cleaning chamber 20, washing with water the inner surfaces of the first and second protection plates 24 and 25 to remove the etching solution from the inner surfaces of the first and second protection plates 24 and 25.

If the cleaning-solution supply pipes 26 and 27 are not provided, as described above, during drying the wafer W in the cleaning chamber 20, appearance abnormality (streaks) may occur on the surface of the wafer W.

For example, after etching of the copper film on the bevel part of the wafer W, the cleaning chamber 20 washes the wafer W with water and dry it. At the time of drying, the cleaning chamber 20 rotates the wafer W at high speeds to dry the wafer W (that is, by spin dry). In spin dry, if the etching solution is attached to the inner surface of the first or the second protection plate 24 or 25, due to an air flow cause by high-speed rotation of the wafer W, the etching solution may be attached to the wafer W while being dried. If the etching solution is attached to the copper film on the center part of the wafer W, due to the centrifugal force caused by rotation of the wafer W, the etching solution moves (splashes) from the center part of to the bevel part of the wafer W, along the surface of the wafer W. In this way, streaks appear on the surface of the copper film from the center part of to the bevel part of the wafer W. Accordingly, the etching solution attached to the inner surface of the first or the second protection plate 24 or 25 may become the cause of streaks.

To the contrary, the semiconductor manufacturing apparatus 1 according to the present embodiment is provided with the cleaning-solution supply pipes 26 and 27 at the upper edge parts of the first and second protection plates 24 and 25, respectively, for washing the inner surfaces of the first and second protection plates 24 and 25 with the pure water. With this mechanism, the etching solution can be washed away from the first and second protection plates 24 and 25. Therefore, when the wafer W is spin-dried, since almost no etching solution remains on the inner surfaces of the first and second protection plates 24 and 25, the etching solution is hardly attached to the wafer W while being dried. As a result, it is achieved to restrict the occurrence of appearance abnormality of streaks.

Figure 5:
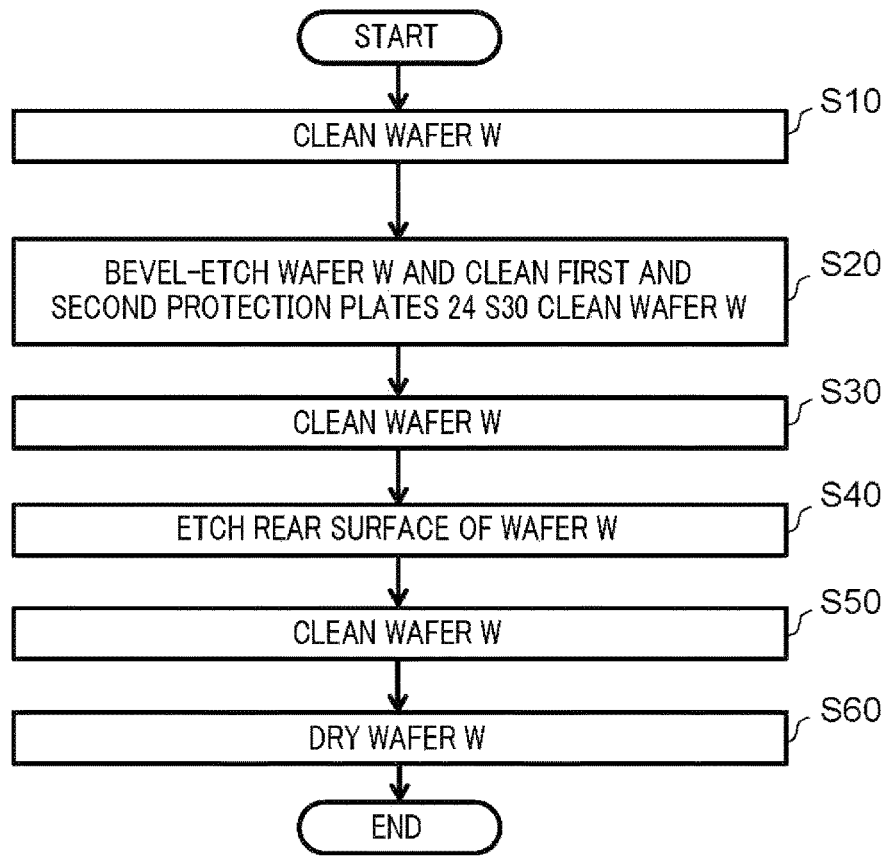
FIG. 5 is a flowchart showing an example of the operation of a copper plating apparatus, after a plating process, according to the first embodiment.

Subsequently, the operation of a copper plating apparatus 1, after a plating process, according to the present embodiment will be explained with reference to FIGS. 4 and 5.

FIG. 4 is a table showing an example of processes of etching the bevel part, water-washing and drying of the wafer W, after the plating process, according to the present embodiment. FIG. 5 is a flowchart showing an example of the operation of the copper plating apparatus 1, after the plating process, according to the present embodiment.

After plating a copper film on the wafer W film in the deposition chamber 10, the transfer unit 40 transfers the wafer W from the film deposition chamber 10 to the cleaning chamber 20.

In the cleaning chamber 20, as a pre-process, the pure-water supply nozzle 23 cleans the wafer W with the pure water (S10), in which the wafer W is cleaned with the pure water (DIW) while being rotated at 200 rpm (Revolution Per Minutes).

Subsequently, using a mixture of sulfuric acid and hydrogen peroxide as an etching solution, the chemical-solution supply nozzle 22 etches the copper film on the bevel part of the wafer W (S20). Hereinbelow, etching the bevel part of the wafer W is also referred to as bevel etching. In the bevel etching, the bevel part of the wafer W is etched with the mixture of sulfuric acid and hydrogen peroxide while the wafer W is being rotated at 200 rpm. In the bevel etching, the mixture of sulfuric acid and hydrogen peroxide is attached to the first and second protection plates 24 and 25. Therefore, the cleaning-solution supply pipes 26 and 27 start water-washing of the first and second protection plates 24 and 25.

Subsequently, the pure-water supply nozzle 23 supplies the pure water to the wafer W to wash the wafer W with the pure water (S30). During the pure water-washing, the cleaning-solution supply pipes 26 and 27 may continue water-washing of the first and second protection plates 24 and 25.

Subsequently, the rear surface of the wafer W is etched with sulfuric acid (S40). In this way, the copper attached to the rear surface of the wafer W is removed. During the etching, the cleaning-solution supply pipes 26 and 27 may continue water-washing of the first and second protection plates 24 and 25.

Subsequently, the pure-water supply nozzle 23 washes the wafer W with the pure water (S50). During the pure water-washing, the cleaning-solution supply pipes 26 and 27 may continue water-washing of the first and second protection plates 24 and 25. When the pure water-washing of the wafer W in the step S50 completes, the cleaning-solution supply pipes 26 and 27 complete the water-washing of the first and second protection plates 24 and 25.

After the completion of the water-washing of the first and second protection plates 24 and 25, the stage 21 rotates the wafer W to spin-dry the wafer W (S60).

The cleaning of the first and second protection plates 24 and 25 may be performed in any period from a moment of the bevel etching in the step S20 to a moment before the start of spin-dry in the step S60, as long as the etching solution attached to the first and second protection plates 24 and 25 can be washed away. For example, the cleaning-solution supply pipes 26 and 27 may continue the cleaning of the first and second protection plates 24 and 25 during the bevel etching in the step S20, and complete the cleaning of the first and second protection plates 24 and 25 when the bevel etching completes. Or the cleaning-solution supply pipes 26 and 27 may not perform the water-washing from the steps S20 to S40 but perform the cleaning of the first and second protection plates 24 and 25 in the step S50 before the drying in the step S60. Furthermore, the cleaning-solution supply pipes 26 and 27 may perform the cleaning of the first and second protection plates 24 and 25 after the step S50 but before the drying in the step S60.

The cleaning-solution supply pipes 26 and 27 may perform the cleaning of the first and second protection plates 24 and 25 at an almost same time and complete at an almost same time. Or the cleaning-solution supply pipes 26 and 27 may perform the cleaning of the first and second protection plates 24 and 25 at different timings. In other words, the supply of a cleaning solution to the first and second protection plates 24 and 25 may be or may not be performed at an almost same time.

The density of the chemical solution attached to the second protection plate 25 may be lower than the density of the chemical solution attached to the first protection plate 24. In this case, the copper plating apparatus 1 may omit the water-washing of the second protection plate 25. In this case, the copper plating apparatus 1 can have a relatively simple configuration with a lower cost.

As described above, the copper plating apparatus 1 according to the present embodiment is capable of supplying the pure water to the inner surfaces of the first and second protection plates 24 and 25 to wash away the etching solution attached to the first and second protection plates 24 and 25, before spin dry, during the supply of the etching solution in the step S50 or after the supply of the etching solution. Accordingly, the copper plating apparatus 1 can restrict the occurrence of appearance abnormality of streaks.

It is known that, by making longer the time for cleaning the wafer W in the step S30 or S50, the density of the etching solution attached to the first and second protection plates 24 and 25 is gradually lowered by means of a cleaning solution, to decrease the rate of appearance of streaks. However, in order to decrease the rate of appearance of streaks, it is required to make extremely longer the time for cleaning the wafer W, which reduces productivity very much.

To the contrary, according to the present embodiment, the appearance of streaks can be restricted without making longer the time for cleaning the wafer W in the step S30 or S50. As a result, the semiconductor manufacturing apparatus does not reduce productivity.

Second Embodiment

Figure 6:
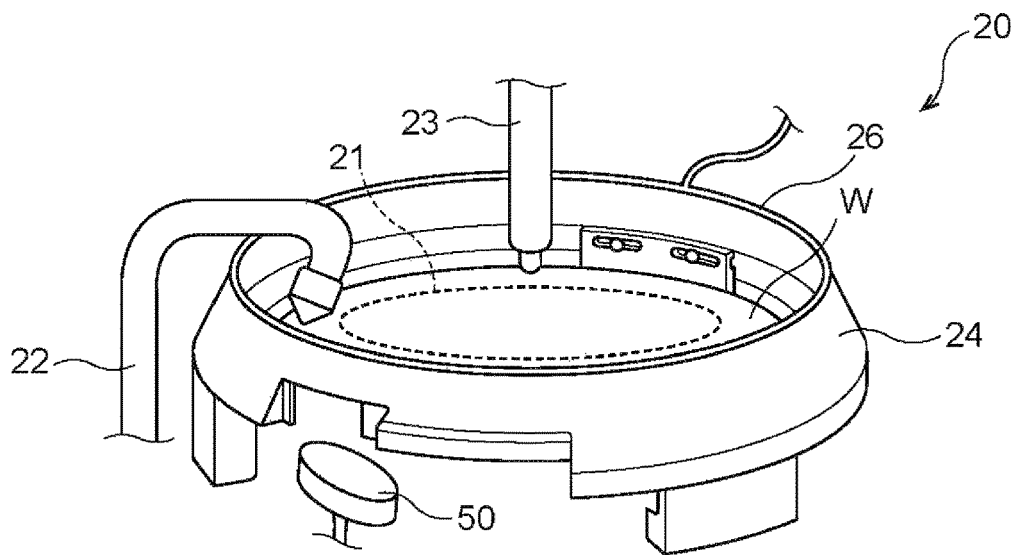
FIG. 6 is a schematic view showing an example of the configuration of a cleaning chamber according to a second embodiment.

FIG. 6 is a schematic view showing an example of the configuration of a cleaning chamber 20 according to a second embodiment. The cleaning chamber 20 according to the second embodiment is different from that of the first embodiment in that it is provided further with a sucking unit 50 instead of or together with the cleaning-solution supply pipes 26 and 27. The other configuration of the second embodiment may be the same as the corresponding configuration of the first embodiment.

The sucking unit 50 is provided below the substrate W and at a position corresponding to that of the chemical-solution supply nozzle 22. The sucking unit 50 is disposed at a position at which the etching solution is dropped from the substrate W, so as to suck the etching solution supplied from the chemical-solution supply nozzle 22 to the wafer W after supplying the etching solution to the wafer W. The sucking unit may, for example, be provided just under the chemical-solution supply nozzle 22 or at a position which is little bit apart in a rotation direction of the wafer W from the position just under the chemical-solution supply nozzle 22. Moreover, the sucking unit 50 may be provided just under the edge part (bevel part) of the wafer W, at which the etching solution is supplied. Having this configuration, the sucking unit 50 can easily receive the etching solution from the wafer W. The opening of the sucking unit 50 is made large enough to receive the etching solution dropped from the wafer W. The shape and location of the sucking unit 50 are not limited to the above example as long as the sucking unit 50 can suck the etching solution from the wafer W.

Figure 7:
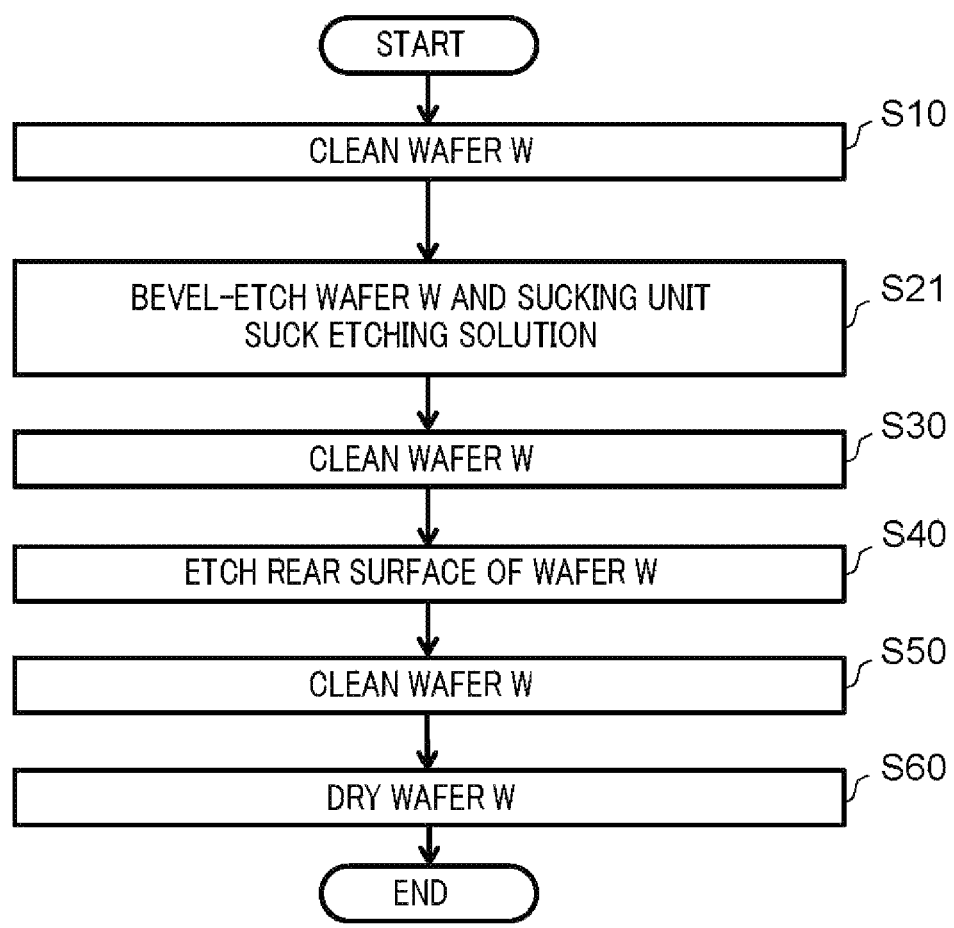
FIG. 7 is a flowchart showing an example of the operation of a copper plating apparatus according to the second embodiment.

FIG. 7 is a flowchart showing an example of the operation of a copper plating apparatus 1 according to the second embodiment.

The operation up to the step S10 is the same as that explained in the first embodiment.

Subsequently, bevel etching is performed using a mixture of sulfuric acid and hydrogen peroxide as an etching solution (S21). The bevel etching itself may be the same as that in the step S20 of the first embodiment. What is different is that, simultaneously with or immediately before the supply of etching solution in the bevel etching, the sucking unit 50 starts sucking of the etching solution. While the etching solution is being supplied to wafer W in the bevel etching, the sucking unit 50 sucks the etching solution supplied onto the wafer W. Thereafter, on completion of the supply of the etching solution onto the wafer W, the sucking unit 50 completes the sucking of the etching solution.

The steps S30 to S60 may be the same as those of the first embodiment. When the cleaning-solution supply pipes 26 and 27 are not provided, the cleaning of the first and second protection plates 24 and 25 are not performed.

The copper plaiting apparatus 1 according to the second embodiment is provided with the sucking unit 50 to directly suck the etching solution supplied to the wafer W, as it is. Therefore, the amount of etching solution attached to the first and second protection plates 24 and 25 decreases or the probability of attachment of the etching solution to the first and second protection plates 24 and 25 decreases. Accordingly, the copper plaiting apparatus 1 according to the second embodiment can restrict, before spin dry, the attachment of the etching solution to the inner surfaces of the first and second protection plates 24 and 25, or can more reliably remove the etching solution on the inner surfaces of the first and second protection plates 24 and 25. As a result, it is achieved more reliably to restrict the occurrence of appearance abnormality of streaks.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a stage capable of mounting a substrate;
a first nozzle supplying a chemical solution onto the substrate;
a first protection plate provided along an outer circumference of the substrate, the first protection plate receiving the chemical solution splashing from the substrate;
a second nozzle provided above the first protection plate, the second nozzle supplying pure water to an inner surface of the first protection plate;
a second protection plate provided at an outside of the first protection plate, the second protection plate receiving the chemical solution splashing from the substrate;
a third nozzle provided above the second protection plate, the third nozzle supplying pure water to an inner surface of the second protection plate; and
a sucker sucking the chemical solution supplied onto the substrate, wherein
an angle of inclination of the inner surface of the first protection plate is zero to 45 degrees with respect to an almost vertical direction,
the inner surface of the first protection plate is hydrophilic so that a contact angle between the inner surface of the first protection plate and pure water is less than 90 degrees,
the second nozzle is a pipe provided along an upper edge part of the first protection plate, the pipe comprising a plurality of first holes,
the first holes are provided to the second nozzle at an inner surface side of the first protection plate,
the third nozzle is a pipe provided along an upper edge part of the second protection plate, the pipe comprising a plurality of second holes,
the second holes are provided to the third nozzle at an inner surface side of the second protection plate, and
the stage rotates the substrate while the chemical solution or the pure water is supplied on the substrate.

* * * * *